US010949293B2

(12) United States Patent
Pawlowski

(10) Patent No.: US 10,949,293 B2
(45) Date of Patent: Mar. 16, 2021

(54) ERRONEOUS BIT DISCOVERY IN MEMORY SYSTEM

(71) Applicant: Micron Technology, Inc., Boise, ID (US)

(72) Inventor: Joseph Thomas Pawlowski, Boise, ID (US)

(73) Assignee: Micron Technology Inc., Boise, ID (US)

( * ) Notice: Subject to any disclaimer, the term of this patent is extended or adjusted under 35 U.S.C. 154(b) by 60 days.

(21) Appl. No.: 16/516,897

(22) Filed: Jul. 19, 2019

(65) Prior Publication Data

US 2020/0034225 A1    Jan. 30, 2020

Related U.S. Application Data

(60) Provisional application No. 62/702,766, filed on Jul. 24, 2018.

(51) Int. Cl.
    *G06F 11/00*    (2006.01)
    *G06F 11/10*    (2006.01)
    *G11C 11/409*   (2006.01)

(52) U.S. Cl.
    CPC ........ *G06F 11/102* (2013.01); *G06F 11/1056* (2013.01); *G11C 11/409* (2013.01)

(58) Field of Classification Search
    CPC .. G06F 11/102; G06F 11/1056; G06F 11/076; G06F 11/075; G06F 11/0766; G11C 11/409; H04L 1/203
    USPC ........ 714/704, 710, 711, 718, 719, 763–767, 714/6.3, 6.32
    See application file for complete search history.

(56) References Cited

U.S. PATENT DOCUMENTS

| 2008/0244188 A1 | 10/2008 | Yoshida |
| 2014/0229793 A1 | 8/2014 | Campbell et al. |
| 2015/0349806 A1* | 12/2015 | Totolos, Jr. ......... H03M 13/353 714/704 |

(Continued)

FOREIGN PATENT DOCUMENTS

KR    20180059151 A    6/2018

OTHER PUBLICATIONS

ISA/KR, International Search Report and Written Opinion of the International Searching Authority, Int'l Appl. No. PCT/US2019/042987, dated Nov. 7, 2019, Korean Intellectual Property Office, Seo-gu, Daejeon, Republic of Korea, 10 pgs.

*Primary Examiner* — Christine T. Tu
(74) *Attorney, Agent, or Firm* — Holland & Hart LLP

(57) ABSTRACT

Methods, systems, and devices for erroneous bit discovery in a memory system are described. A controller or memory controller, for example, may read a code word from a memory medium. The code word may include a set of bits that each correspond to a respective Minimum Substitution Region (MSR) of the memory medium. Each MSR may include a portion of memory cells of the memory medium and be associated with a counter to count a quantity of erroneous bits in each MSR. When the controller identifies a quantity of erroneous bits in the code word using an error control operation, the controller may update values of counters associated with respective MSRs that correspond to the quantity of erroneous bits to count erroneous bit counts for each MSR. In some cases, the controller may perform operations described herein as part of a background operation.

20 Claims, 6 Drawing Sheets

(56) References Cited

U.S. PATENT DOCUMENTS

| | | | |
|---|---|---|---|
| 2016/0203046 A1* | 7/2016 | Hanafusa | G06F 3/0653 |
| | | | 714/764 |
| 2016/0274970 A1 | 9/2016 | Earhart | |
| 2018/0060194 A1 | 3/2018 | Ryu et al. | |
| 2019/0140667 A1* | 5/2019 | Ren | H03M 13/1515 |

* cited by examiner

ERRONEOUS BIT DISCOVERY IN MEMORY SYSTEM

CROSS REFERENCE

The present Application for Patent claims priority to U.S. Provisional Patent Application No. 62/702,766 by Pawlowski, entitled "ERRONEOUS BIT DISCOVERY IN MEMORY SYSTEM" filed Jul. 24, 2018, which is assigned to the assignee hereof and is expressly incorporated by reference in its entirety.

BACKGROUND

The following relates generally to operating a memory subsystem or system and more specifically to erroneous bit discovery in a memory system.

A computing system may include a memory subsystem or system including various kinds of memory devices and controllers that are coupled with one or more buses to manage information in numerous electronic devices such as computers, wireless communication devices, internet of things, cameras, digital displays, and the like. Memory devices are widely used to store information in such electronic devices. Information is stored by programing different states of a memory device. For example, binary devices have two states, often denoted by a logic "1" or a logic "0." In other systems, more than two states may be stored in memory devices. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous DRAM (SDRAM), ferroelectric RAM (FeRAM), magnetic RAM (MRAM), resistive RAM (RRAM), flash memory, not-AND (NAND) memory, phase change memory (PCM), and others. Memory devices may be volatile or non-volatile. Non-volatile memory cells may maintain their stored logic states for extended periods of time even in the absence of an external power source. Volatile memory cells (e.g., DRAM cells) may lose their stored state (e.g., immediately or over time) when disconnected from an external power source.

Improving a computing system may include enhancing a memory system's performance, such as reducing power consumption, increasing memory capacity and reliability, improving read/write speeds, providing non-volatility by use of persistent memory media, or reducing manufacturing costs at a certain performance point, among other metrics.

DETAILED DESCRIPTION

Figure 1:
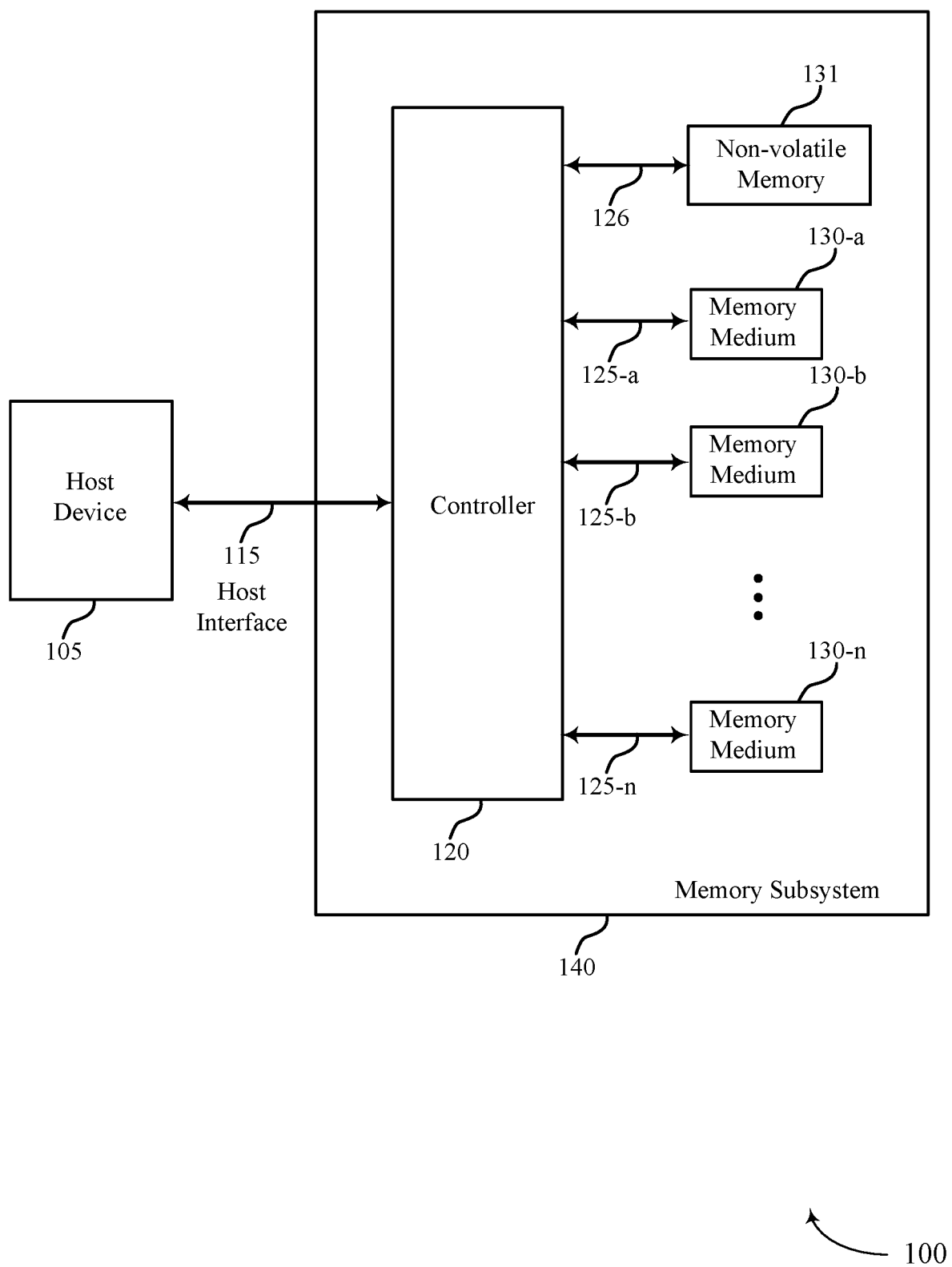
FIG. 1 illustrates an example of a computing system that supports erroneous bit discovery in a memory system in accordance with aspects disclosed herein.

Performance of a computing system (e.g., a server including a memory system or subsystem) may depend on various factors, such as supplying reliable information to the computing system with a low latency (e.g., a load-to-use latency). In the context of a computing system or subsystem, data carrying information may be referred to as a code word. In some cases, a code word may include an amount of user data and additional bits (e.g., bits supporting an error control operation) carrying various information to provide reliable user data with a low latency. A code word may be associated with elements of a computing system, such as a memory medium of a memory system or subsystem, and may be transmitted and received during one or more access operations, or a background operation, or both. A background operation in a computing system may refer to a process that runs without a user intervention (e.g., an access command from a host device).

In some cases, memory cells of one or more memory dice in a memory medium may support a finite quantity of access operations (e.g., read cycles, or write cycles, or both) before becoming unreliable or problematic. When a memory cell is unreliable, information the memory cell produces may become faulty or invalid, and such a memory cell (or information produced by the memory cell) may be referred to as an erroneous bit. When a quantity of memory cells associated with a code word generates erroneous bits, the code word (e.g., user data in the code word) may become faulty or invalid beyond an error recovery capability of a memory system or subsystem. Thus, a system reliability may improve by identifying a region (e.g., a portion of memory array of a memory die) in the memory medium including erroneous bits (e.g., unreliable memory cells) such that the region may be replaced or substituted with a reliable region. In some cases, a controller (e.g., a port manager associated with the memory medium) may determine to replace the region based on a quantity of erroneous bits present in the region relative to a threshold.

A memory array of a memory die may be configured to include a set of Minimum Substitution Regions (MSRs). An MSR may be configured as a reasonable fault containment zone to efficiently manage erroneous bits in the memory array. In some cases, an MSR may include a group of memory cells configured as a unit of data associated with an error control operation. Further, at least some, if not each, bit of a code word may be associated with a respective MSR of the set. A group of MSRs across a set of channels of the memory medium (e.g., the group of MSRs operating in parallel) may retain a quantity of code words. The group of MSRs configured to produce the quantity of code words may be referred to as an MSR strip or an MSR region, in some cases.

Each MSR of the set may be associated with a counter configured to count a quantity of erroneous bits in each MSR of the set. Namely, when a controller (which may also be referred to as a memory controller) performs an error control operation for a code word and identifies an erroneous bit (e.g., a faulty or unreliable memory cell or information) that corresponds to a first MSR of the set, the controller may update a first counter associated with the first MSR of the set to count a total quantity of erroneous bits in the first MSR of the set. In some cases, the controller may sort values (e.g., erroneous bit counts) retained in the counters to identify a subset of the MSRs having higher erroneous bit counts compared to other MSRs. As such, the controller may identify the most problematic MSRs (e.g., based on erroneous bit counts relative to a threshold) as candidates for replacement.

A controller may perform one or more operations described (e.g., reading a code word from a memory medium, identifying erroneous bits in the code word, correcting erroneous bits if there are any, updating a value of a counter associated an MSR corresponding to an erroneous bit, writing the code word back to the memory medium) as part of a background operation. The controller may, in some cases, perform the background operation for a set of code words retained in a memory medium. The set of code word may be all the code words retained in the memory medium and the controller may perform the background operation one code word at a time (e.g., serially) for the entire set of code words. Further, the controller may repeat the background operation for the all the code words retained in the memory medium, which may include periodically performing the background operation for one or more code words. The background operation may be referred to as a media scrubber operation (which may also be referred to as a media scrubbing function), in some cases.

A controller, while performing the background operation, may save an indication of an error status associated with a code word (e.g., a quantity of erroneous bits associated with an MSR of a code word), which may include saving the indication in a separate memory array. In some cases, such a memory array may be disposed in a port manager and may include a static random access memory (SRAM) cell. A size of the memory array allocated to store the indication of an error status may be determined based on a size of an MSR of a memory medium, a quantity of MSRs associated with a code word, an error correction capability for the indication of the error status, or a quantity of memory dice corresponding to a channel of a memory medium. The size of the memory array may be determined based on a combination of these factors, or additional factors. In some cases, an alternative size (e.g., a smaller size) of the memory array may be allocated based on an identification of one or more MSRs of a quantity of MSRs associated with a code word, a quantity of spare bits in the code word, or a quantity of bit fields associated with a channel of a plurality of channels within the code word, or a combination thereof, among others.

Further, the controller may transfer information (e.g., an indication of the error status) associated with a code word to a non-volatile memory while performing a background operation (e.g., a media scrubber operation). In some cases, the controller may receive, from a power management component of a memory system or subsystem, an indication of a power level that may indicate a power change or loss incident. The non-volatile memory may, in some cases, be referred to as a persistent memory and may maintain their logic states for an extended period of time even in the absence of an external power source. As such, the non-volatile memory may preserve such information (e.g., the indication of the error status) transferred from the controller during a power change or loss incident. The controller may resume the interrupted background operation by restoring the information (e.g., the indication of the error status) from the non-volatile memory when the power is restored or otherwise adjusted for the memory system or subsystem.

Features of the disclosure introduced herein are further described below at an exemplary system level in the context of FIG. 1. Specific examples of a system and a configuration of a memory medium of the system are then described in the context of FIGS. 2 through 3. These and other features of the disclosure are further illustrated by and described with reference to an apparatus diagram of FIG. 4 that describes various components related to a controller as well as flowcharts of FIGS. 5 through 6 that relate to operations of erroneous bit discovery in a memory system.

FIG. 1 illustrates an example of a computing system 100 that supports erroneous bit discovery in a memory system in accordance with aspects disclosed herein. The computing system 100 may include a host device 105 coupled with a device 140 through a host interface 115 (which may also be referred to as a host link). The host device 105 may be or include a server, a system on a chip (SoC), a central processing unit (CPU), or a graphics processing unit (GPU), among other examples. In some examples, the host device 105 may access (e.g., read from, write to) one or more memory media 130 located in the device 140 through the host interface 115.

The host interface 115 (e.g., a host link) may be compatible with or employ a protocol (e.g., the Gen-Z, the Cache Coherent Interconnect for Accelerators (CCIX) protocol) to facilitate access operations between the host device 105 and the one or more memory media 130. The host interface 115 may be configured to transfer data at a first data transfer rate (e.g., 25 gigabytes per second (GBps)) in at least one direction (e.g., sending or receiving). In some examples, a 25 GBps data transfer rate may support approximately 586 million transactions per second when a transaction size is 64 bytes. In other examples, a 25 GBps data transfer rate may support approximately 312.5 million transactions per second when a transaction size is 128 bytes.

The device 140 may, in some cases, be referred to as a memory system or subsystem, or a memory device. In some cases, the device 140 may include a power management component. The power management component may monitor a power level that may indicate a power change or loss related to the device 140 or the computing system 100. In some cases, the power level may fluctuate beyond a normal range to indicate such a power change or loss incident. The device 140 may include a controller 120 that may be coupled with one or more memory media 130 through channels 125. In some cases, the channels 125 may be referred to as aggregated channels 125 including a plurality of other channels (e.g., channels having a smaller bandwidth than the aggregated channel 125) as described with reference to FIG. 2. The device 140 may include a non-volatile memory 131 that is coupled with the controller 120 through a channel 126. In some examples, the controller 120, the one or more memory media 130, or the non-volatile memory 131, or any combination thereof, may be integrated with, in contact with, or placed on a board (e.g., a peripheral component interconnect express (PCIe) board). In some cases, the non-volatile memory 131 may be integrated as part of the controller 120.

The controller 120 may include various functional blocks that facilitate operations of the device 140 in conjunction with the one or more memory media 130. In some case, the power management component may be integrated as part of the controller 120. In some cases, the controller 120 may include aspects of an interface controller to accommodate different specifications, constraints, or characteristics associated with the host interface 115, the channels 125, the channel 126, or any combination thereof. In some examples, the controller 120 may be an ASIC, a general-purpose processor, other programmable logic device, discrete hardware components (e.g., a chiplet), or it may be a combination of components.

In some cases, the controller 120 may read data from or write data at a memory medium 130 (e.g., a memory medium 130-a) in conjunction with a local controller (e.g., local to the memory medium 130-a) that may perform various operations (e.g., writing data to memory cells, reading data from memory cells, arranging a code word in accordance with a code word format or a forwarded code word format). In some examples, the local controller may send requested data to the controller 120 through one of the channels 125, which may be an example of an aggregated channel.

Each memory medium (e.g., a memory medium 130-a) may include multiple memory dice (e.g., forty-four (44) memory dice) to obtain a specified or desired memory capacity of the memory medium. In some examples, the memory dice may include a three-dimensional cross-point array of memory cells including chalcogenide (e.g., 3DXP memory dice including 3D XPoint™ memory cells). In other examples, the memory dice may include other kinds of memory devices (e.g., FeRAM dice, MRAM dice, PCM dice). In some examples, a code word (e.g., a code word including 128 bytes of user data) may be divided across the multiple memory dice within a memory medium (e.g., a memory medium 130-a).

In some cases, each memory die (e.g., each 3DXP memory die) of the multiple memory dice may produce a quantity of data (e.g., 128 bits of data) as a unit from the memory die in association with an access operation (e.g., a read operation). The amount of data (e.g., 128 bits of data) may include a sequence of bursts (e.g., sixteen (16) bursts), each burst including an amount of data (e.g., eight (8) bits of data) transmitted over a bus (e.g., 8-bits wide bus) from the memory die. As an example, when a memory medium includes eleven (11) memory dice operating in parallel, and when each memory die of the eleven (11) memory dice produces eight (8) bits of data at a given burst, the memory medium may produce 88 bits of data for the given burst. As eleven (11) memory dice may produce data over a total of sixteen (16) bursts, each burst including 88 bits of data from eleven (11) memory dice, a unit of data associated with the memory medium during an access operation—e.g., the unit of data transmitted over the channel (e.g., an aggregated channel)—may include 1,408 bits.

As such, a code word (e.g., a unit of data during a transaction of an access operation) associated with a memory medium may include 1,408 bits, in this example. In some cases, a burst may be referred to as a channel burst or a data burst. In some cases, a channel between the controller 120 and a memory medium (e.g., a memory medium 130-a) may include a plurality of channels, in which each channel may be associated with one or more memory dice of the memory medium (e.g., a memory medium 130-a).

A memory medium (e.g., a memory medium 130-a) may include a set of memory dice that each include a memory array. Each memory die of the set (e.g., each memory array) may be configured to include a set of MSRs as described with reference to FIG. 3. An MSR may be configured as a reasonable fault containment zone to efficiently manage (e.g., replace, substitute) erroneous bits in the memory array. Further, each MSR of the set may be associated with a counter configured to count a quantity of erroneous bits in each MSR of the set.

The channels 125 may be configured to transport data (e.g., a code word) between the controller 120 and the one or more memory media 130. Each of the channels 125 (e.g., the channel 125-a that may be an example of an aggregated channel) may include a plurality of other channels (e.g., channels having a smaller bandwidth than the channel 125-a) for transporting data (e.g., a code word) in parallel. In some cases, a code word may include user data (e.g., 128 bytes of user data in a code word) and other set of data (e.g., remaining data in the code word to produce reliable data with a low latency). Each of the channels 125 (e.g., the channel 125-a that may be an example of an aggregated channel) may include additional channels to carry information related to various auxiliary functions such as metadata. In some cases, a code word format (which may also be referred to as a code word layout) or a forwarded code word layout (e.g., a forwarded code word layout) may define how each of the channels 125 (e.g., the channel 125-a) may transport data (e.g., a code word) between the controller 120 and the one or more memory media 130.

The non-volatile memory 131 may include an array of non-volatile memory cells that may maintain their logic states for an extended period of time even in the absence of an external power source. For example, the non-volatile memory cells may be or include 3D XPoint™ memory cells, PCM cells, FeRAM cells, or NAND memory cells, among other examples. Further, the non-volatile memory 131 may be configured to communicate information with the controller 120 through the channel 126. For example, the non-volatile memory 131 may receive information from the controller 120 through the channel 126 and store the information when a power loss or change related to the computing system 100 is detected.

In some cases, the memory subsystem or system, which may include device 140, may include a power management component to manage a power loss or change incident. The power management component may be operable to detect a sign of power loss or change (e.g., a power level indicating a power loss that may occur) and transmit an indication of the sign of power loss or change to the controller 120. The controller 120 may, upon receiving the indication, transfer information (e.g., indication of error status associated with a code word) saved in a memory array (e.g., SRAM memory array) in the controller 120 to the non-volatile memory 131. The non-volatile memory 131 may store the information such that the information may be preserved in the absence of a power supply to the memory subsystem or system, which may include device 140. When the power to the computing system 100 is restored or otherwise adjusted, the controller 120 may retrieve the information from the non-volatile memory 131 to resume an operation that has been interrupted by the power loss incident based on the information preserved in the non-volatile memory 131.

In some cases, the controller 120 may read a code word from an address of a memory medium (e.g., a memory medium 130-a) that includes a set of MSRs, where the code word includes a set of bit fields (e.g., a set of bits) associated with a set of channels associated with the memory medium. The controller 120 may determine a quantity of erroneous bits in the code word using an error control operation that may be based on a size of one or more MSRs of the set. The controller 120 may update a counter associated with an MSR of the set when an erroneous bit of the quantity corresponds to the MSR of the set. In some cases, the controller 120 may correct the quantity of erroneous bits in the code word using a subset of the bit fields (e.g., bits supporting an error correction code to restore logic states of the quantity of erroneous bits).

Further, the controller 120 may write the code word back to the address of the memory medium after correcting the quantity of erroneous bits (or without correcting erroneous bits when there are no erroneous bits in the code word). The controller 120 may write the corrected code word back to the address of the memory medium to mitigate erroneous bits accumulated in the code word over time, in some cases. In other cases, even if there are no erroneous bits in the code word, the controller 120 may write the code word back to the address of the memory medium to mitigate undesired changes in electrical characteristics of memory cells that retain the code word—e.g., a drift in a threshold voltage of a memory cell that may happen over an extended period of time. The controller 120 may retrieve the code word from the address of the memory medium (and write the code word back to the address of the memory medium) as part of a background operation independent of an access command from a host. In some cases, the controller 120 may periodically retrieve the code word as part of the background operation.

Figure 2:
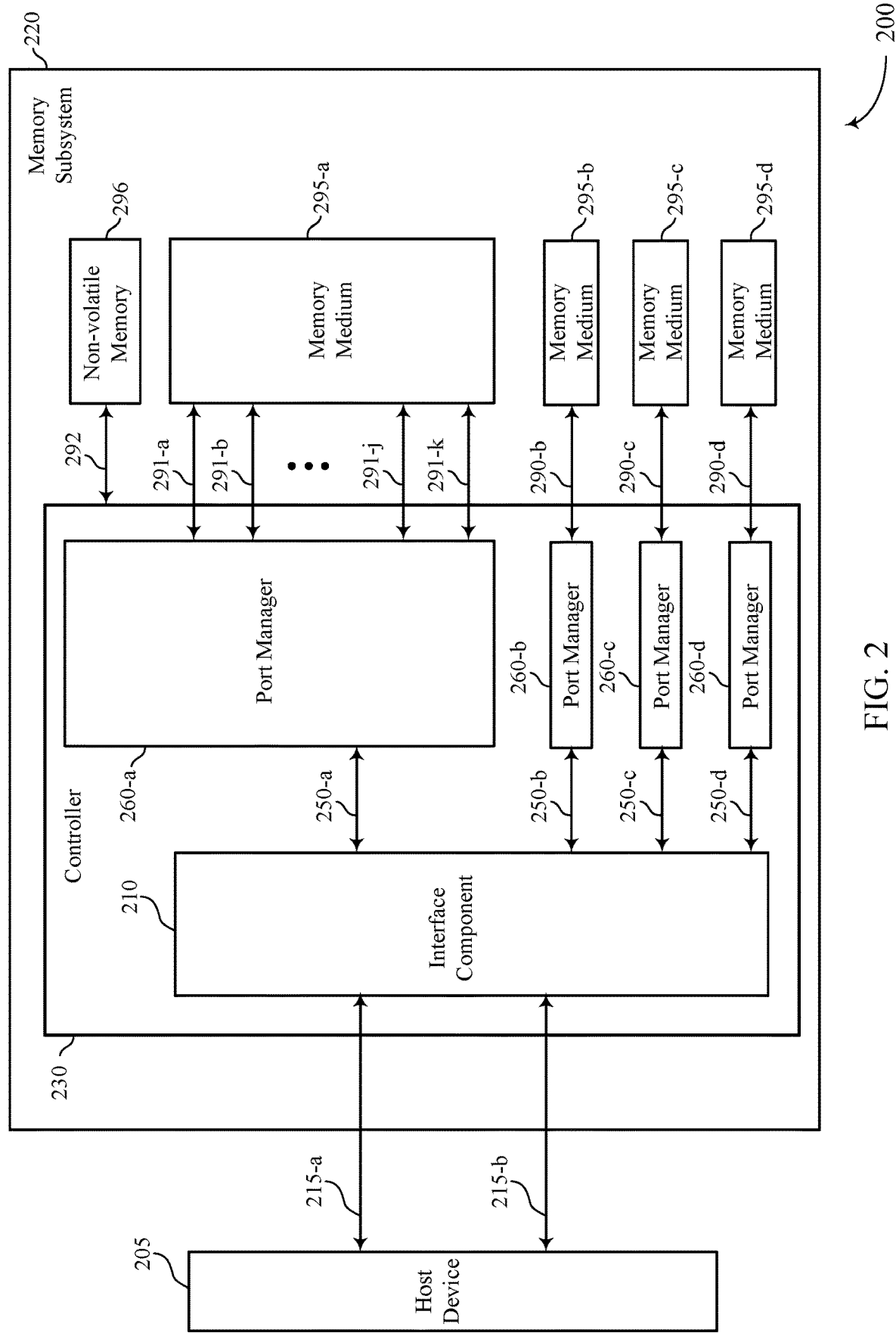
FIG. 2 illustrates an example of a computing system that supports erroneous bit discovery in a memory system in accordance with aspects disclosed herein.

FIG. 2 illustrates an example of a computing system 200 that supports erroneous bit discovery in a memory system in accordance with aspects disclosed herein. The computing system 200 may be an example of the computing system 100 described with reference to FIG. 1. The computing system 200 may include a host device 205 coupled with a memory subsystem or system 220 using at least one host interface (e.g., a host interface 215-a). In some cases, the host interfaces 215 may be referred to as a host link or host links. The host device 205 may be an example of the host device 105 described with reference to FIG. 1. The host interfaces 215 may be examples of the host interface 115 described with reference to FIG. 1. In some examples, the host interfaces 215 may be configured to transfer data at a first data transfer rate (e.g., 50 GBps with 25 GBps in each direction).

The computing system 200 may include the memory subsystem or system 220. The memory subsystem or system 220 may be an example of the device 140 described with reference to FIG. 1. The memory subsystem or system 220 may be referred to as a memory device or memory devices. The memory subsystem or system 220 may include a controller 230. In some cases, the memory subsystem or system 220 may include a power management component. The power management component may monitor a power level that may indicate a power loss incident to the memory subsystem or system 220 or the computing system 200. In some cases, the power level may fluctuate beyond a normal range to indicate such a power loss or change incident. The controller 230 may be an example of the controller 120 described with reference to FIG. 1. The controller 230 may include an interface component 210 and a plurality of port managers 260. In some cases, the power management component may be integrated as part of the controller 230.

The interface component 210 may be configured to facilitate data exchange between the host device 205 and the memory subsystem or system 220 through the host interfaces 215. The interface component 210 may be configured to exchange data with the plurality of port managers 260 (e.g., using signal paths 250). Each signal path of the signal paths 250 may be configured to exchange data at a rate (e.g., 12.8 GBps) different than the first data transfer rate of the host interfaces 215. In some cases, the interface component 210 may be configured to provide a routing network function to allow more than one host interface (e.g., host interface 215-a and host interface 215-b) to be associated with the plurality of port managers 260.

The memory subsystem or system 220 may include a non-volatile memory 296. The non-volatile memory 296 may be configured to communicate information with the controller 230 through a channel 292. The non-volatile memory 296 may be an example of the non-volatile memory 131 described with reference to FIG. 1. Also, the channel 292 may be an example or include aspects of the channel 126 described with reference to FIG. 1. Further, the non-volatile memory 296 may be configured to communicate information with port managers 260 in the controller 230. For example, the port managers 260 may transfer various information to the non-volatile memory 296 through the channel 292 and save the information in the non-volatile memory 296 when the port managers 260 receive an indication of a power loss incident to the computing system 200 or the memory subsystem or system 220. In some cases, the non-volatile memory 296 may be integrated as part of the controller 230.

Each port manager (e.g., the port manager 260-b) of the plurality of the port managers 260 may be coupled with a memory medium (e.g., the memory medium 295-b) through an aggregated channel (e.g., the aggregated channel 290-b). In some cases, each port manager of the plurality may be coupled with different one or more memory media 295. In some examples, an individual port manager (e.g., the port manager 260-a) of the plurality of port managers 260 may operate independent of each other (e.g., the port managers 260-b, 260-c, and 260-c) and may support access operations or background operations associated with one or more memory media 295. The one or more memory media 295 may be examples of the one or more memory media 130 described with reference to FIG. 1. In some cases, each of the one or more memory media 295 may be referred to as a media port.

Each aggregated channel of the aggregated channels 290 may include one or more channels 291. In some cases, the channels 291 may be referred to as logical channels 291. In some examples, each channel 291 may be associated with one or more memory dice in a memory medium (e.g., the memory medium 295-a) and may have a smaller bandwidth than the bandwidth of the aggregated channel (e.g., the aggregated channel 290-b). In some examples, an aggregated channel (e.g., an aggregated channel 290-a) may include eleven (11) channels 291 (e.g., channels 291-a through 291-k). As a person of ordinary skill in the art would appreciate, the plurality of channels 291 (e.g., the channels 291-a through the channel 291-k) are depicted for the port manager 260-a representing one of the aggregated channels 290 (e.g., the aggregated channel 290-a) while the other aggregated channels 290 (e.g., the aggregated channels 290-b, 290-c, and 290-d) are depicted for port managers 260-b, 260-c, and 260-d without showing the plurality of channels 291 associated with each aggregated channel, which is so depicted in order to increase visibility and clarity of the illustrated features.

An individual memory medium (e.g., the memory medium 295-a) of the one or more memory media 295 may include one or more memory devices (e.g., 3DXP memory dice). In some cases, the memory devices in the individual memory medium may be configured to operate in parallel to obtain a desired (or a specified) aggregated bandwidth through one of the aggregated channels 290. A 3DXP memory die, as one example, may be configured to have a 8-bits wide data bus and may be associated with each of channels 291 (e.g., the channel 291-a) rendering each channel 291 being 8-bits wide. In addition, a 3DXP memory die may be configured to produce 128-bits of data during a sequence of sixteen (16) bursts, in which each burst may produce 8-bits wide data over the channel 291. As such, 128-bits of data may be considered as a single unit of data that each 3DXP memory die generates based on an access command (or during a background operation) reading memory cells within the 3DXP memory die.

In some cases, a code word (or a forwarded code word) may be configured to include a set of bit fields associated with a plurality of data bursts (e.g., a sequence of sixteen (16) bursts) across a plurality of channels (e.g., eleven (11) channels 291-*a* through 291-*k* generating 88 bits of data per data burst). As such, the code word may in some cases include 1,408 bits of information. The description herein may be understood from a logical view of the memory medium. A larger quantity of physical 3DXP memory dice than a quantity of logical 3DXP memory dice may be present in a memory medium accounting for an overhead related to various access operations (e.g., read operation, write operation) or background operations associated with the memory medium. Within a memory medium, a code word may be divided into parts and written to or read from more than one die (e.g., 128 byte user data retained across ten (10) 3DXP memory dice) as described with reference to FIG. 3.

Various examples described herein use 3DXP memory dice (e.g., including 3D XPoint™ memory cells) to illustrate how the memory media 295 may be configured and operate in conjunction with the port managers 260 in accordance with the methods, devices, and systems supporting erroneous bit discovery in a memory system disclosed herein. In some cases, the memory media 295 may include other types of memory devices employing different memory technologies than 3DXP memory technology, such as FeRAM technology, PCM technology, MRAM technology, among others. As such, the concepts disclosed herein are not limited to a particular memory technology (e.g., 3D XPoint™ memory technology).

A memory medium (e.g., a memory medium 295-*a*) may include a set of memory dice that each include a memory array. Each memory die of the set (e.g., each memory array) may be configured to include a set of MSRs as described with reference to FIG. 3. An MSR may be configured as a reasonable fault containment zone to efficiently manage (e.g., replace, substitute) erroneous bits in the memory array. In some cases, each bit of a code word (e.g., each of 1,408 bits in a code word) may be associated with a respective MSR of the set (e.g., 1,408 MSRs). A group of MSRs across a set of channels of a memory medium (e.g., channels 291-*a* through 291-*k* of the memory medium 295-*a*) may be configured to operate in parallel to retain or to generate a quantity of code words. The group of MSRs configured to produce the quantity of code words may be referred to as an MSR strip or an MSR region, in some cases. Further, each MSR of the set may be associated with a counter configured to count a quantity of erroneous bits in each MSR of the set.

In some cases, a device or system may include a memory medium (e.g., a memory medium 295-*a*) including a plurality of MSRs, where the memory medium (e.g., the memory medium 295-*a*) may be configured to generate a code word including a set of bit fields. Each bit field of the set may correspond to a respective MSR of the plurality. Further, an MSR of the plurality may be associated with a counter to count a quantity of erroneous bits of the MSR of the plurality. In some cases, a port manager (e.g., a port manager 260-*a*) may be in electronic communication with the memory medium (e.g., the memory medium 295-*a*) and the port manager may be operable to read the code word from an address of the memory medium, determine a quantity of erroneous bits in the code word using an error control operation that may be based on a size of one or more MSRs of the plurality, or write the code word back to the address of the memory medium based on the quantity of erroneous bits, or a combination thereof.

In some cases, the port manager (e.g., the port manager 260-*a*) may be further configured to identify information included in a subset of bit fields (e.g., bits related to an error correction code to restore logic states of the quantity of erroneous bits), and correct the quantity of erroneous bits in the code word using the identified information included in the subset of bit fields, where the code word written back to the address of the memory medium may be based on correcting the quantity of erroneous bits in the code word. In some cases, the port manager (e.g., the port manager 260-*a*) may be further configured to update a value of a counter associated with an MSR of the plurality based on the quantity of erroneous bits in the code word.

Figure 3:
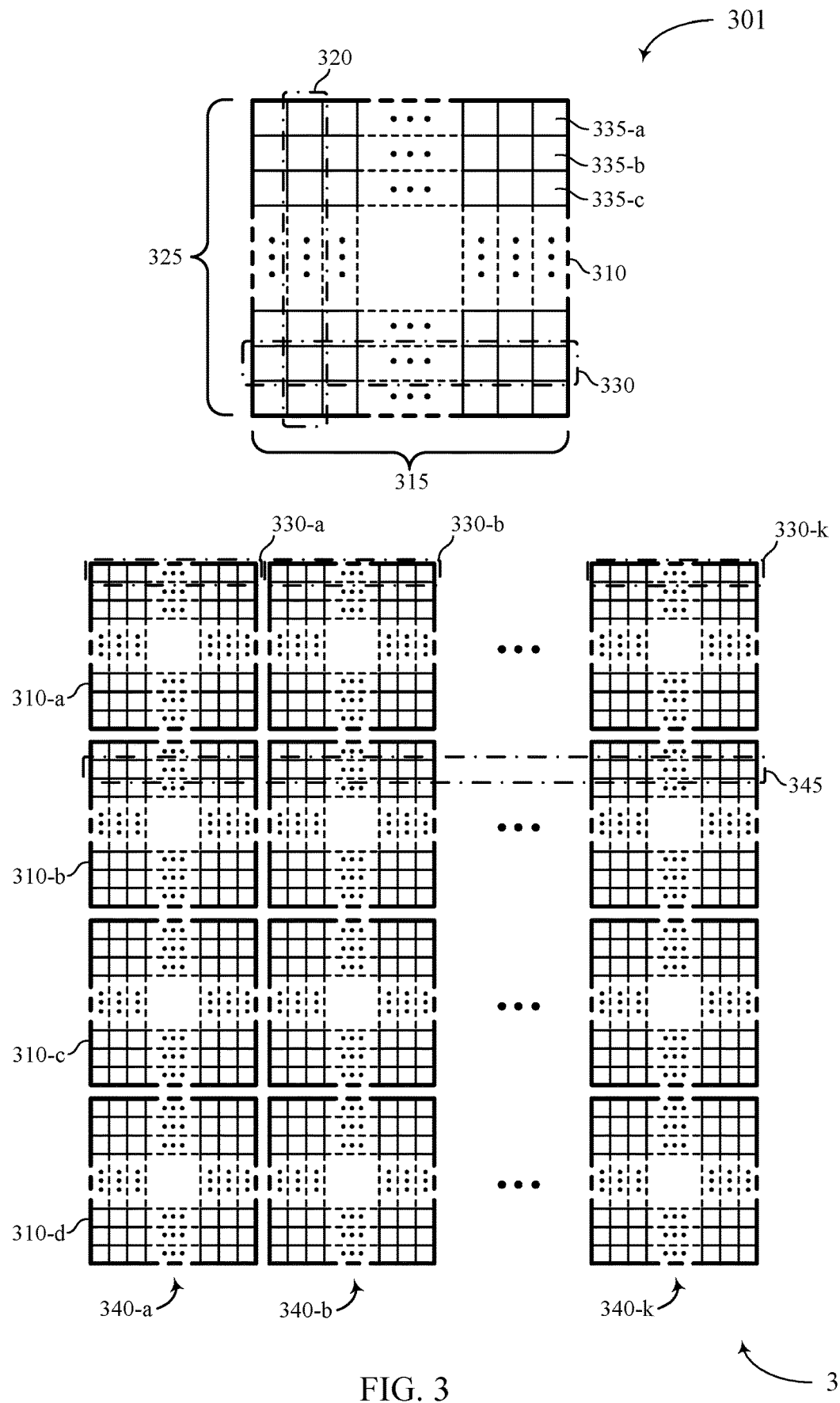
FIG. 3 illustrates examples of a configuration of a memory die and a configuration of a memory medium that support erroneous bit discovery in a memory system in accordance with aspects disclosed herein.

FIG. 3 illustrates examples of a configuration 301 of a memory array and a configuration 302 of a memory medium that support erroneous bit discovery in a memory system in accordance with aspects disclosed herein. The memory array depicted in the configuration 301 may be an example of a memory die in a memory medium (e.g., memory medium 130 or memory medium 295) described with reference to FIGS. 1 and 2. The memory medium depicted in the configuration 302 may be an example of a memory medium (e.g., memory medium 130 or memory medium 295) described with reference to FIGS. 1 and 2. The memory medium depicted in the configuration 302 may include a quantity of memory arrays (e.g., forty-four (44) memory arrays) that each may be configured according to the configuration 301.

The configuration 301 may include a memory array 310. In some cases, the memory array 310 may include a set of memory cells (e.g., 512 Giga-bits of memory cells, $2^{39}$ memory cells). The memory array 310 may be organized to have an array width 315 and an array depth 325. In some cases, the array width 315 may be referred to as a die width 315 and the array depth 325 may be referred to as a die depth 325. Further, the array width 315 and the array depth 325, each may be divided into a quantity of partitions. In some cases, the array width 315 may be divided into 128 sections. Hence, a section 320 depicted in the configuration 301 may represent one of 128 sections in the array width 315. Further, each section (e.g., the section 320) may be divided into 128 pieces such that the array depth 325 may be divided into 128 sticks. A stick may be referred to as a section, subsection, a part, element, etc. Hence, a stick 330 depicted in the configuration 301 may represent one of 128 sticks in the array depth 325.

As such, the memory array 310 (e.g., 512 Giga-bits of memory cells) may be divided into a quantity of segments 335 (e.g., a segment 335-*a*, 335-*b*, or 335-*c*) that are each depicted as a box inside of the memory array 310 as one example. The memory array 310 may include 16,384 segments as a result of dividing the array width 315 into 128 sections that each are further divided into 128 sticks (e.g., sections, subsections, parts, elements) in the array depth 325, in this example. Each segment 335 of the memory array 310 may be referred to as an MSR 335. In some cases, an MSR 335 may include a group of memory cells (e.g., $2^{25}$ memory cells) that may be configured as a unit of data associated with an error control operation. An MSR may be configured as a reasonable fault containment zone to efficiently manage (e.g., replace, substitute) erroneous bits in the memory array.

A quantity of sections (e.g., 128 sections) in the array width 315 may be determined based on a manner of constructing a memory array in a memory die. For example, a memory array may have a quantity of tiles (e.g., 128 tiles) and the quantity of sections in the array width 315 may be based on the quantity of tiles of the memory array 310. Similarly, a quantity of sticks (e.g., 128 sticks) in the array depth 325 may be determined based on common features associated with various functional components, such as row decoders, column decoder, among others. As a result of dividing the memory array 310 as depicted in the configuration 301, each segment 335 (e.g., an MSR including $2^{25}$ memory cells out of 16,384 MSRs in a memory array including 512 Giga-bits) may provide a group of memory cells (e.g., a unit of data) to efficiently manage (e.g., replace, substitute) erroneous bits in the memory array 310 without incurring a significant overhead. In some cases, a size of the unit of memory cells (e.g., $2^{25}$ memory cells of an MSR) may be referred to as a granularity of data to support efficient error control operations associated with a memory medium.

Still referring to the configuration 301, a stick 330 across a quantity of sections (e.g., 128 sections) may represent a first quantity of bits (e.g., 128 bits) produced by the memory array 310 as a part of a code word (e.g., part of a code word including 1,408 bits). The first quantity of bits (e.g., 128 bits) of the stick 330 may be further multiplexed down to a set of a second quantity of bits (e.g., eight (8) bits), where each set of the second quantity of bits (e.g., eight (8) bits) may be produced at a given data burst (e.g., one of sixteen (16) data bursts that produce a total of 128 bits). As such, the stick 330 may produce a part of a code word, in which each segment 335 (e.g., MSR 335) contributes one bit of the first quantity of bits (e.g., 128 bits) of the code word. Further, the stick 330 (e.g., 128 bits produced over 16 data bursts) may correspond to a channel (e.g., channel 291-*a*) described with reference to FIG. 2. A complete code word (e.g., a code word of 1,408 bits) may be produced when a quantity of memory arrays 310 (e.g., eleven (11) memory arrays 310) operates in parallel such that each memory arrays may produce a part of bits constituting the complete code word—e.g., each memory array 310 producing 128 bits over sixteen (16) data bursts across eleven (11) channels.

The configuration 302 may include a set of memory arrays 310 (e.g., forty-four (44) memory arrays 310) to achieve a desirable or specified storage capacity of a memory medium (e.g., a memory medium 130 or a memory medium 295 described with reference to FIGS. 1 and 2). The set of memory arrays in the memory medium may be arranged to form a plurality of channels for the memory medium. In some cases, the memory medium may include eleven (11) channels 340-*a* through 340-*k* as illustrated in the configuration 302. Each channel 340 may be an example or include aspects of a channel 291 (e.g., one of channel 291-*a* through 291-*k*) described with reference to FIG. 2. Further, each channel of the plurality (e.g., channel 340-*a*, 340-*b*, or 340-*k*) may be configured to include a subset of the memory arrays. In some cases, a channel of the plurality (e.g., channel 340-*a*) may include four (4) memory arrays 310-*a* through 310-*d*. As such, each channel of the plurality may, in some cases, include a total quantity of sticks 330 (e.g., 512 sticks) that correspond to a multiple of a quantity of sticks of a memory array 310 (e.g., 128 sticks) times a quantity of memory arrays 310 (e.g., four (4) memory arrays) within the channel.

A stick 330-*a* of a channel 340-*a* may produce a part of a code word (e.g., 128 bits out of 1,408 bits of a code word) as depicted in the configuration 302. For example, a memory medium of the configuration 302 may produce a complete code word including 1,408 bits by having a total of eleven (11) sticks operating in parallel—e.g., sticks 330-*a* through 330-*k*, each producing 128 bits over sixteen (16) data bursts in parallel. Each segment 335 (e.g., an MSR 335) may contribute one (1) bit of 1,408 bits of the code word. A group of MSRs across a plurality of channels (e.g., eleven (11) channels, channels 340-*a* through 340-*k*) that produces a code word may be referred to as an MSR strip (e.g., an MSR strip 345 depicted in the configuration 302), in some cases. For example, the memory medium of the configuration 302 includes 512 MSR strips. Also, an MSR strip (e.g., an MSR strip 345) may correspond to a collective array depth (e.g., a collective die depth) of a memory medium—e.g., an MSR strip 345 depicted in the configuration 302 may correspond to the 130th array depth (e.g., the 130th MSR strip out of a total array depth of 512 MSR strips) of the memory medium, in which each memory array 310 includes 128 MSR strips. An MSR strip may also be referred to as an MSR region.

Each MSR (e.g., MSR 335-*a*, MSR 335-*b*, MSR 335-*c*) of a memory array (e.g., memory array 310) may be associated with a counter configured to count a quantity of erroneous bits therein. For example, a port manager (e.g., a port manager 260-*a* described with reference to FIG. 2) may, as part of a background operation, read a code word from an MSR strip (e.g., the MSR strip 345) and perform an error control operation for the code word. The port manager may identify a quantity of erroneous bits and correct the quantity of erroneous bits in the code word using a set of bits in the code word (e.g., bits supporting an error correction function). Each erroneous bit of the quantity (e.g., a faulty or unreliable memory cell) may correspond to a respective MSR of the MSR strip. The port manager may update a first counter associated with the first MSR of the MSR strip to count a quantity of erroneous bits (e.g., erroneous bit counts) in the first MSR of the MSR strip.

In some cases, the quantity of erroneous bits in a code word may be preconfigured based on an error recovery capability of an error control operation associated with the code word. For example, a code word may be encoded using a Bose-Chaudhury-Hocquenghem (BCH) code that may be capable of detecting and correcting (e.g., recovering) sixteen (16) erroneous bits out of 1,408 bits in a code word. Further, a code word may be configured to support an entire channel replacement (e.g., 128 bits (e.g., bit fields) of a channel) when a quantity of erroneous bits in the channel exceeds a certain threshold. As such, a port manager may identify a total of 144 erroneous bits in a code word and update up to 144 counters associated with 144 MSRs (e.g., one MSR corresponding to an erroneous bit) as a result of reading a code word and discovering the quantity of erroneous bits in the code word, in this example.

The port manager may sort values (e.g., erroneous bit counts) stored in the counters for a code word (e.g., 1,408 counters that each correspond to 1,408 MSRs) to identify a subset of the values that is greater than remaining values. For example, the port manager may sort the values (e.g., erroneous bit counts) in descending order to identify a subset of the values (e.g., 160 highest erroneous bit counts out of 1,408 erroneous bits counts associated with a code word). In this manner, the port manager may identify a subset of MSRs that each include higher quantities of erroneous bits than the rest. The port manager may identify the subset of MSRs (e.g., 160 MSRs out of 1,408 MSRs) as candidates for a replacement (e.g., substituting such MSRs with MSRs that are reliable, e.g., spare MSRs). In some cases, the port manager may configure a quantity of values of the subset (e.g., 200 highest erroneous bit counts instead of 160 highest erroneous bit counts) based on a quantity of erroneous bits identified in a code word. Such a quantity of values of the subset (e.g., a subset of MSRs identified as candidates for replacement) may be based on various factors (e.g., a memory technology used to fabricate a memory device of a memory medium, a maturity of such memory technology, a memory medium usage pattern) in some cases.

Further, the port manager may replace one or more MSRs (e.g., a subset of MSRs identified as candidates for replacement) having higher erroneous bit counts with a set of spare MSRs until the set of spare MSRs is exhausted. The port manager may determine to replace an MSR based on a quantity of erroneous bits (e.g., erroneous bit counts) in the MSR relative to a threshold. In some cases, the port manager may determine to replace an MSR having erroneous bit counts equal to or greater than the threshold. The threshold may be based on a raw bit error rate (RBER) associated with a memory medium. Also, the threshold may be based on a size of an MSR (e.g., $2^{25}$ bits in an MSR). In some cases, the threshold may be configurable (e.g., programmable) to account for a maturity of technology used for fabricating memory cells of a memory medium, process variations that may affect electrical characteristics of memory cells of a memory medium, for example.

The port manager may save information indicative of an error status (e.g., a quantity of erroneous bits) of a code word in a separate memory array. In some cases, the memory array may be integrated as part of the port manager. In some cases, the memory array may include a static random access memory (SRAM) cells. A size of the memory array allocated for saving the information may be based on a size of an MSR (e.g., $2^{25}$ bits in an MSR) associated with a memory medium, a quantity of MSRs associated with a code word (e.g., 1,408 MSRs in a code word), an error correction capability for the indication of the error status, or a quantity of memory dice (e.g., four (4) memory dice) corresponding to a channel of the memory medium, or any combination thereof. In some cases, a different (e.g., a smaller) size of the memory array may be allocated to save similar information indicative of an error status of a code word based on an identification of an MSR of a quantity of MSRs associated with a code word (e.g., an identification for each of 1,408 MSRs in a code word), a quantity of spare bits in a code word (e.g., twenty-two (22) spare bits in a code word), or a quantity of bit fields (e.g., 128 bits) associated with a channel of a plurality of channels within a code word, or any combination thereof.

In some cases, the port manager may receive an indication of a power level from a power management component coupled with the port manager and transfer the information (e.g., indication of the error status) saved in the memory array (e.g., SRAM memory array) to a non-volatile memory (e.g., a persistent memory) as described with reference to FIGS. 1 and 2.

The port manager may read a code word from a memory medium as part of a background operation to identify a quantity of erroneous bits associated with the code word and update a value of a counter associated an MSR that corresponds to an erroneous bit of the quantity. The port manager may, in some cases, perform background operations described (e.g., reading a code word, identifying a quantity of erroneous bits in the code word, updating counters associated with respective MSRs corresponding to the quantity of erroneous bits in the code word, correcting the quantity of erroneous bits, writing the code word back to the memory medium) for a set of code words retained in a memory medium. The set of code words may include entire code words retained in a memory medium and the port manager may perform the background operation one code word at a time (e.g., serially). The set of code words may include entire code words retained in a memory medium and the port manager may perform the background operation for multiple code words (e.g., concurrently, simultaneously). Further, the port manager may repeat the background operation for all the code words retained in the memory medium, resulting in a periodicity in performing the background operation for a code word in the memory medium. The background operation may be referred to as a media scrubber operation (which may also be referred to as a media scrubbing function), in some cases.

Figure 4:
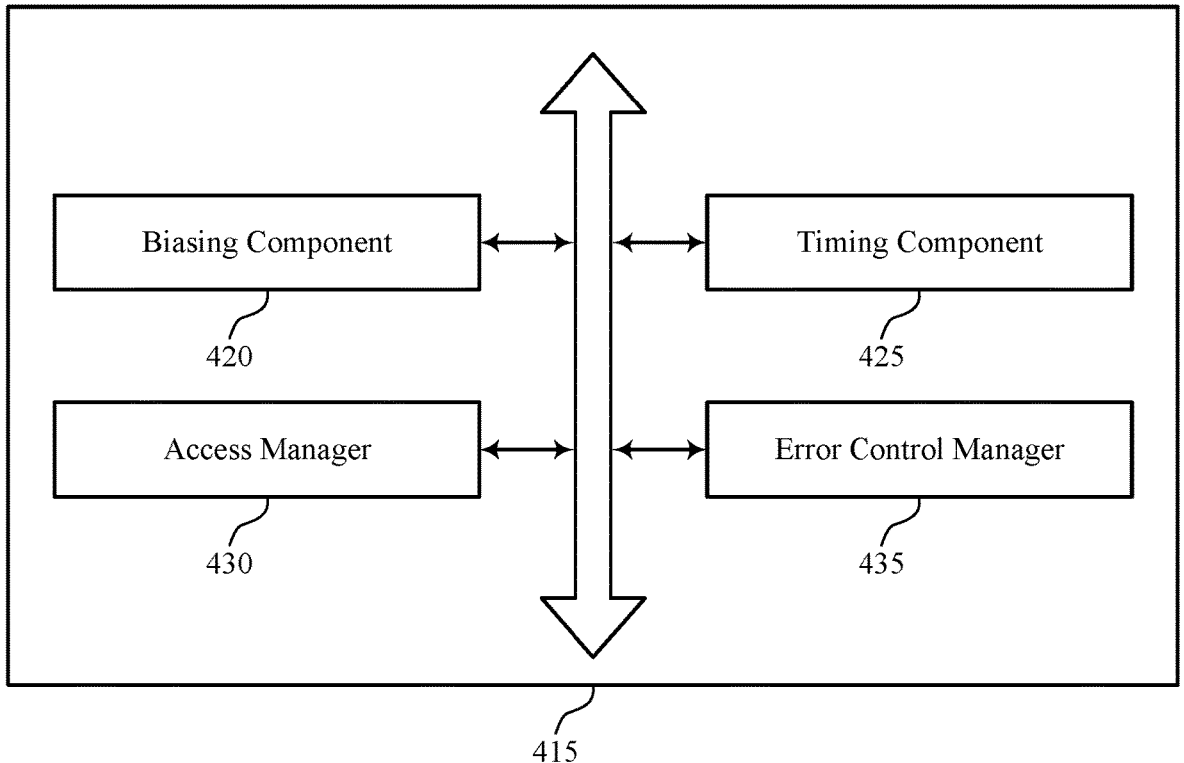
FIG. 4 shows a block diagram of a device that supports erroneous bit discovery in a memory system in accordance with aspects disclosed herein.

FIG. 4 shows a block diagram 400 of a controller 415 that supports erroneous bit discovery in a memory system in accordance with aspects disclosed herein. The controller 415 may be an example of aspects of the controller 120 or the controller 230 described with reference to FIGS. 1 through 2. The controller 415 may include a biasing component 420, a timing component 425, an access manager 430, and an error control manager 435. Each of these modules may communicate, directly or indirectly, with one another (e.g., via one or more buses).

The access manager 430 may read a code word from an address of a memory medium that includes a plurality of MSRs, where the code word may include a set of bit fields associated with a plurality of data bursts across a plurality of channels. In some cases, the access manager 430 may write the code word back to the address of the memory medium based on a quantity of erroneous bits in the code word. In some examples, the MSR includes a group of memory cells that may be configured as a unit of data associated with the error control operation, where the group of memory cells corresponds to a portion of a memory array of the memory medium. In some cases, the access manager 430 may retrieve the code word as part of a background operation independent of an access command from a host where determining the quantity of erroneous bits may be based on retrieving the code word. In some cases, the access manager 430 may retrieve a plurality of code words retained at the memory medium by retrieving each code word serially, where determining the quantity of erroneous bits may be based on serially retrieving each code word. In some cases, the access manager 430 may receive a code word from a memory medium as part of a background operation.

The error control manager 435 may determine a quantity of erroneous bits in the code word using an error control operation that may be based on a size of one or more MSRs of the plurality. In some cases, the error control manager 435 may correct the quantity of erroneous bits in the code word using a subset of the bit fields, where the code word written back to the address of the memory medium may be based on correcting the quantity of erroneous bits in the code word. In some cases, each bit field of the set may be associated with a respective MSR of the plurality and at least one MSR of the plurality may be associated with a counter configured to count a quantity of erroneous bits corresponding to the at least one MSR of the plurality. In some cases, the error control manager 435 may update a value of a counter associated with a second MSR of the plurality based on the quantity of erroneous bits in the code word, where at least one erroneous bit of the quantity corresponds to the second MSR of the plurality.

In some cases, the error control manager 435 may write a first value of a counter to a memory space of a port manager, where the first value of the counter may be based on the quantity of erroneous bits. In some cases, the error control manager 435 may sort a set of values retained at the memory space based on writing the first value. In some cases, the error control manager 435 may identify a subset of the values based on sorting the set of values, where each value of the subset may be greater than a remainder of the values of the set. In some cases, the error control manager 435 may configure a quantity of values of the subset based on the quantity of erroneous bits. In some cases, the error control manager 435 may identify counters corresponding to the identified subset of values. In some cases, the error control manager 435 may identify MSRs of the plurality associated with the identified counters as candidates for a replacement, where the code word written back to the address of the memory medium may be based on identifying the MSRs of the plurality associated with the identified counters.

In some cases, a maximum quantity of erroneous bits in the code word may be preconfigured based on a quantity of bit fields associated with a channel of the plurality of channels or a threshold associated with a quantity of erroneous bits that the code word may be preconfigured to recover, or a combination thereof. In some cases, the error control manager 435 may identify a quantity of erroneous bits in the code word based on receiving the code word. In some cases, the error control manager 435 may write an indication of an error status of the code word to at least one memory cell of a memory space of a port manager, where the indication of the error status may be based on the quantity of erroneous bits in the code word. In some cases, the error control manager 435 may transfer the indication of the error status written to the at least one memory cell of the memory space to a non-volatile memory. In some cases, the error control manager 435 may receive an indication of a power level from a power management component coupled with the port manager, where transferring the indication of the error status to the non-volatile memory may be based on receiving the indication of the power level.

In some cases, a size of the memory space for retaining the indication of the error status may be based on a size of a MSR associated with the memory medium, a quantity of MSRs associated with the code word, an error correction capability for the indication of the error status, or a quantity of memory dice corresponding to a channel of the memory medium, or any combination thereof. In some cases, a size of the memory space for retaining the indication of the error status may be based on an identification of an MSR of a quantity of MSRs associated with the code word, a quantity of spare bits in the code word, or a quantity of bit fields associated with a channel of a plurality of channels within the code word, or any combination thereof. In some cases, the at least one memory cell of the memory space of the port manager may include a static random access memory (SRAM) cell.

Figure 5:
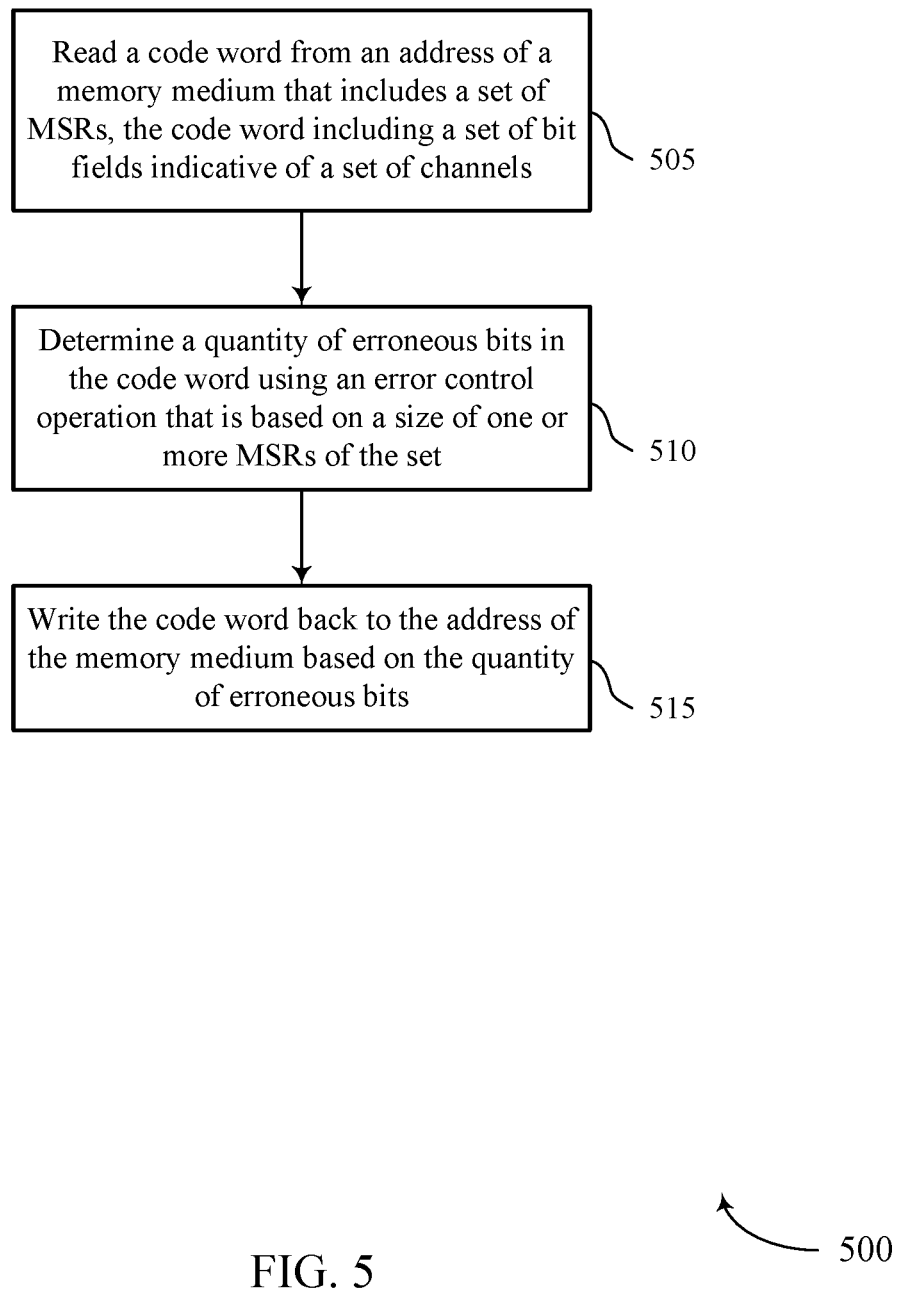
FIGS. 5 through 6 illustrate a method or methods supporting erroneous bit discovery in a memory system in accordance with aspects disclosed herein.

FIG. 5 shows a flowchart illustrating a method 500 that supports erroneous bit discovery in a memory system in accordance with aspects disclosed herein. The operations of method 500 may be implemented by a controller or its components as described with reference to FIGS. 1 through 2. For example, the operations of method 500 may be performed by the controller 120 or the controller 230 described with reference to FIGS. 1 through 2. In some examples, a controller 230 may execute a set of codes to control the functional elements of the device to perform the functions described below. Additionally or alternatively, the controller 230 may perform aspects of the functions described below using special-purpose hardware.

At 505 the controller 230 may read a code word from an address of a memory medium that includes a plurality of MSRs, where the code word may include a set of bit fields associated with a plurality of data bursts across a plurality of channels. The operations of 505 may be performed according to the methods described with reference to FIGS. 1-4. In certain examples, aspects of the operations of 505 may be performed by an access manager as described with reference to FIG. 4.

At 510 the controller 230 may determine a quantity of erroneous bits in the code word using an error control operation that may be based on a size of one or more MSRs of the plurality. The operations of 510 may be performed according to the methods described with reference to FIGS. 1-4. In certain examples, aspects of the operations of 510 may be performed by an error control manager as described with reference to FIG. 4.

At 515 the controller 230 may write the code word back to the address of the memory medium based on the quantity of erroneous bits. The operations of 515 may be performed according to the methods described with reference to FIGS. 1-4. In certain examples, aspects of the operations of 515 may be performed by an access manager as described with reference to FIG. 4.

An apparatus for performing a method or methods, such as the method 500, is described. The apparatus may include means for reading a code word from an address of a memory medium that includes a plurality of MSRs, the code word including a set of bit fields indicative of a plurality of channels, means for determining a quantity of erroneous bits in the code word using an error control operation that may be based on a size of one or more MSRs of the plurality, and means for writing the code word back to the address of the memory medium based on the quantity of erroneous bits.

Another apparatus for performing a method or methods, such as the method 500, is described. The apparatus may include a memory medium and a controller in electronic communication with the memory medium, where the controller may be operable to read a code word from an address of a memory medium that includes a plurality of MSRs, the code word including a set of bit fields indicative of a plurality of channels, determine a quantity of erroneous bits in the code word using an error control operation that may be based on a size of one or more MSRs of the plurality, and write the code word back to the address of the memory medium based on the quantity of erroneous bits.

Some examples of the method 500 and apparatuses described herein may further include processes, features, means, or instructions for correcting the quantity of erroneous bits in the code word using a subset of the bit fields, where the code word written back to the address of the memory medium may be based on correcting the quantity of erroneous bits in the code word. In some examples of the method 500 and apparatuses described herein, each bit field of the set may be associated with a respective MSR of the plurality and at least one MSR of the plurality may be associated with a counter configured to count a quantity of erroneous bits corresponding to the at least one MSR of the plurality.

Some examples of the method 500 and apparatuses described herein may further include processes, features, means, or instructions for updating a value of a counter associated with a second MSR of the plurality based on the quantity of erroneous bits in the code word, where at least one erroneous bit of the quantity corresponds to the second MSR of the plurality. In some examples of the method 500 and apparatuses described herein, the MSR includes a group of memory cells that may be configured as a unit of data associated with the error control operation, the group of memory cells corresponding to a portion of a memory array of the memory medium. Some examples of the method 500 and apparatuses described herein may further include processes, features, means, or instructions for writing a first value of a counter to a memory space of a port manager, where the first value of the counter may be based on the quantity of erroneous bits.

Some examples of the method 500 and apparatuses described herein may further include processes, features, means, or instructions for sorting a set of values retained at the memory space based on writing the first value. Some examples of the method 500 and apparatuses described herein may further include processes, features, means, or instructions for identifying a subset of the values based on sorting the set of values, where each value of the subset may be greater than a remainder of the values of the set. Some examples of the method 500 and apparatuses described herein may further include processes, features, means, or instructions for configuring a quantity of values of the subset based on the quantity of erroneous bits.

Some examples of the method 500 and apparatuses described herein may further include processes, features, means, or instructions for identifying counters corresponding to the identified subset of values. Some examples of the method 500 and apparatuses described herein may further include processes, features, means, or instructions for identifying MSRs of the plurality associated with the identified counters as candidates for a replacement, where the code word written back to the address of the memory medium may be based on identifying the MSRs of the plurality associated with the identified counters. Some examples of the method 500 and apparatuses described herein may further include processes, features, means, or instructions for retrieving the code word as part of a background operation independent of an access command from a host, where determining the quantity of erroneous bits may be based on retrieving the code word.

Some examples of the method 500 and apparatuses described herein may further include processes, features, means, or instructions for retrieving a plurality of code words retained at the memory medium by retrieving each code word serially, where determining the quantity of erroneous bits may be based on serially retrieving each code word. In some examples of the method 500 and apparatuses described herein, a maximum quantity of erroneous bits in the code word may be preconfigured based on a quantity of bit fields associated with a channel of the plurality of channels or a threshold associated with a quantity of erroneous bits that the code word may be preconfigured to recover, or a combination thereof.

Figure 6:
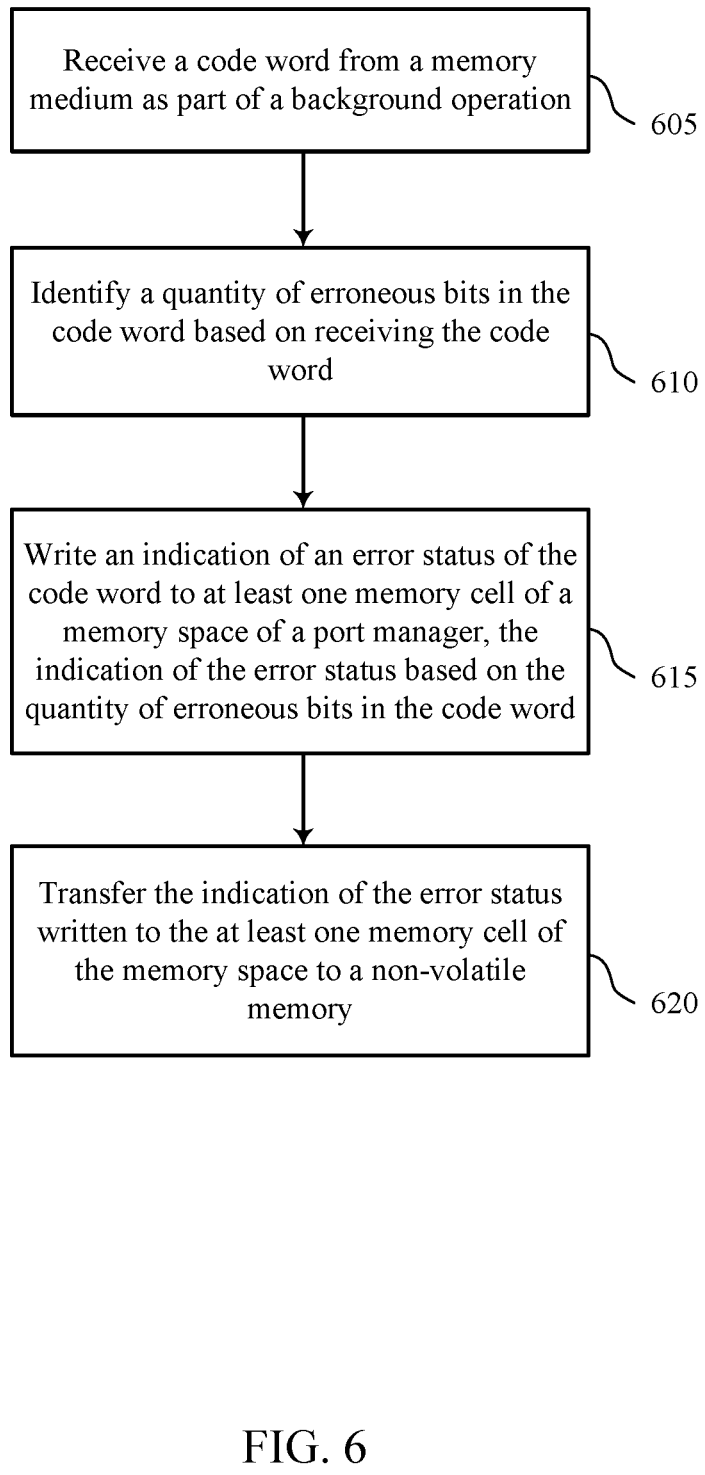

FIG. 6 shows a flowchart illustrating a method 600 that supports erroneous bit discovery in a memory system in accordance with aspects disclosed herein. The operations of method 600 may be implemented by a controller or its components as described with reference to FIGS. 1 through 2. For example, the operations of method 600 may be performed by the controller 120 or the controller 230 described with reference to FIGS. 1 through 2. In some examples, a controller 230 may execute a set of codes to control the functional elements of the device to perform the functions described below. Additionally or alternatively, the controller 230 may perform aspects of the functions described below using special-purpose hardware.

At 605 the controller 230 may receive a code word from a memory medium as part of a background operation. The operations of 605 may be performed according to the methods described with reference to FIGS. 1-4. In certain examples, aspects of the operations of 605 may be performed by an access manager as described with reference to FIG. 4.

At 610 the controller 230 may identify a quantity of erroneous bits in the code word based on receiving the code word. The operations of 610 may be performed according to the methods described with reference to FIGS. 1-4. In certain examples, aspects of the operations of 610 may be performed by an error control manager as described with reference to FIG. 4.

At 615 the controller 230 may write an indication of an error status of the code word to at least one memory cell of a memory space of a port manager, the indication of the error status based on the quantity of erroneous bits in the code word. The operations of 615 may be performed according to the methods described with reference to FIGS. 1-4. In certain examples, aspects of the operations of 615 may be performed by an error control manager as described with reference to FIG. 4.

At 620 the controller 230 may transfer the indication of the error status written to the at least one memory cell of the memory space to a non-volatile memory. The operations of 620 may be performed according to the methods described with reference to FIGS. 1-4. In certain examples, aspects of the operations of 620 may be performed by an error control manager as described with reference to FIG. 4.

An apparatus for performing a method or methods, such as the method 600, is described. The apparatus may include means for receiving a code word from a memory medium as part of a background operation, means for identifying a quantity of erroneous bits in the code word based on receiving the code word, means for writing an indication of an error status of the code word to at least one memory cell of a memory space of a port manager, the indication of the error status based on the quantity of erroneous bits in the code word, and means for transferring the indication of the error status written to the at least one memory cell of the memory space to a non-volatile memory.

Another apparatus for performing a method or methods, such as the method 600, is described. The apparatus may include a memory medium and a controller in electronic communication with the memory medium, where the controller may be operable to receive a code word from a memory medium as part of a background operation, identify a quantity of erroneous bits in the code word based on receiving the code word, write an indication of an error status of the code word to at least one memory cell of a memory space of a port manager, the indication of the error status based on the quantity of erroneous bits in the code word, and transfer the indication of the error status written to the at least one memory cell of the memory space to a non-volatile memory.

Some examples of the method 600 and apparatuses described herein may further include processes, features, means, or instructions for receiving an indication of a power level from a power management component coupled with the port manager, where transferring the indication of the error status to the non-volatile memory may be based on receiving the indication of the power level. In some examples of the method 600 and apparatuses described herein, a size of the memory space for retaining the indication of the error status may be based on a size of an MSR associated with the memory medium, a quantity of MSRs associated with the code word, an error correction capability for the indication of the error status, or a quantity of memory dice corresponding to a channel of the memory medium, or any combination thereof.

In some examples of the method 600 and apparatuses described herein, a size of the memory space for retaining the indication of the error status may be based on an identification of an MSR of a quantity of MSRs associated with the code word, a quantity of spare bits in the code word, or a quantity of bit fields associated with a channel of a plurality of channels within the code word, or any combination thereof. In some examples of the method 600 and apparatuses described herein, the at least one memory cell of the memory space of the port manager includes a static random access memory (SRAM) cell.

It should be noted that the methods described herein describe possible implementations, and that the operations and the steps may be rearranged or otherwise modified and that other implementations are possible. Further, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Examples are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein, including memory media 130, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the herein description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope disclosed herein. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can include RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    reading a code word from an address of a memory medium that comprises a plurality of Minimum Substitution Regions (MSRs), the code word comprising a set of bit fields associated with a plurality of channels;
    determining a quantity of erroneous bits in the code word using an error control operation that is based on at least in part on a size of one or more MSRs of the plurality of MSRs; and
    writing the code word back to the address of the memory medium based on at least in part on the quantity of erroneous bits.

2. The method of claim 1, further comprising:
    correcting the quantity of erroneous bits in the code word using a subset of the set of bit fields, wherein the code word written back to the address of the memory medium is based on at least in part on correcting the quantity of erroneous bits in the code word.

3. The method of claim 1, wherein:
    each bit field of the set is associated with a respective MSR of the plurality of MSRs and at least one MSR of the plurality of MSRs is associated with a counter configured to count a quantity of erroneous bits corresponding to the at least one MSR of the plurality of MSRs.

4. The method of claim 1, further comprising:
    updating a value of a counter associated with a second MSR of the plurality of MSRs based on at least in part on the quantity of erroneous bits in the code word, wherein at least one erroneous bit of the quantity corresponds to the second MSR of the plurality of MSRs.

5. The method of claim 1, wherein the MSR comprises a group of memory cells that is configured as a unit of data associated with the error control operation, the group of memory cells corresponding to a portion of a memory array of the memory medium.

6. The method of claim 1, further comprising:
    writing a first value of a counter to a memory space of a port manager, wherein the first value of the counter is based on at least in part on the quantity of erroneous bits.

7. The method of claim 6, further comprising:
    sorting a set of values retained at the memory space based on at least in part on writing the first value; and
    identifying a subset of the values based on at least in part on sorting the set of values, wherein each value of the subset is greater than a remainder of the values of the set.

8. The method of claim 7, further comprising:
    configuring a quantity of values of the subset based on at least in part on the quantity of erroneous bits.

9. The method of claim 7, further comprising;
    identifying counters corresponding to the identified subset of values; and
    identifying MSRs of the plurality of MSRs associated with the identified counters as candidates for a replacement, wherein the code word written back to the address of the memory medium is based on at least in part on identifying the MSRs of the plurality of MSRs associated with the identified counters.

10. The method of claim 1, wherein reading the code word from the address of the memory medium further comprises:

retrieving the code word as part of a background operation independent of an access command from a host, wherein determining the quantity of erroneous bits is based on at least in part on retrieving the code word.

11. The method of claim 1, wherein reading the code word from the address of the memory medium further comprises:
retrieving a plurality of code words retained at the memory medium by retrieving each code word serially, wherein determining the quantity of erroneous bits is based on at least in part on serially retrieving each code word.

12. The method of claim 1, wherein:
a maximum quantity of erroneous bits in the code word is preconfigured based on at least in part on a quantity of bit fields associated with a channel of the plurality of channels or a threshold associated with a quantity of erroneous bits that the code word is preconfigured to recover, or a combination thereof.

13. An apparatus, comprising:
a memory medium comprising a plurality of Minimum Substitution Regions (MSRs), the memory medium configured to generate a code word comprising a set of bit fields that each correspond to a respective MSR of the plurality of MSRs, wherein an MSR of the plurality of MSRs is associated with a counter to count a quantity of erroneous bits of the MSR of the plurality of MSRs; and
a port manager in electronic communication with the memory medium, the port manager operable to:
read the code word from an address of the memory medium;
determine a quantity of erroneous bits in the code word using an error control operation that is based on at least in part on a size of one or more MSRs of the plurality of MSRs; and
write the code word back to the address of the memory medium based on at least in part on the quantity of erroneous bits.

14. The apparatus of claim 13, wherein the port manager is further configured to:
identify information included in a subset of bit fields; and
correct the quantity of erroneous bits in the code word using the identified information included in the subset of bit fields, wherein the code word written back to the address of the memory medium is based on at least in part on correcting the quantity of erroneous bits in the code word.

15. The apparatus of claim 13, wherein the port manager is further configured to:
update a value of a counter associated with an MSR of the plurality of MSRs based on at least in part on the quantity of erroneous bits in the code word.

16. A method, comprising:
receiving a code word from a memory medium as part of a background operation;
identifying a quantity of erroneous bits in the code word based on at least in part on receiving the code word;
writing an indication of an error status of the code word to at least one memory cell of a memory space of a port manager, the indication of the error status based on at least in part on the quantity of erroneous bits in the code word; and
transferring the indication of the error status written to the at least one memory cell of the memory space to a non-volatile memory.

17. The method of claim 16, further comprising:
receiving an indication of a power level from a power management component coupled with the port manager, wherein transferring the indication of the error status to the non-volatile memory is based on at least in part on receiving the indication of the power level.

18. The method of claim 16, wherein a size of the memory space for retaining the indication of the error status is based on at least in part on:
a size of a Minimum Substitution Region (MSR) associated with the memory medium, a quantity of MSRs associated with the code word, an error correction capability for the indication of the error status, or a quantity of memory dice corresponding to a channel of the memory medium, or any combination thereof.

19. The method of claim 16, wherein a size of the memory space for retaining the indication of the error status is based on at least in part on:
an identification of an MSR of a quantity of MSRs associated with the code word, a quantity of spare bits in the code word, or a quantity of bit fields associated with a channel of a plurality of channels within the code word, or any combination thereof.

20. The method of claim 16, wherein:
the at least one memory cell of the memory space of the port manager comprises a static random access memory (SRAM) cell.

* * * * *